US012587427B2

(12) United States Patent
Litjes et al.

(10) Patent No.: US 12,587,427 B2
(45) Date of Patent: Mar. 24, 2026

(54) QUADRATURE SIGNAL PROCESSOR USING SINGLE ANALOG-TO-DIGITAL CONVERTER UNIT

(71) Applicant: NXP B.V., Eindhoven (NL)

(72) Inventors: Alphons Litjes, Zijtaart (NL); Erik Olieman, Waalre (NL); Thomas Baier, Graz (AT); Robert Van Veldhoven, Valkenswaard (NL); Yuting Shen, Eindhoven (NL)

(73) Assignee: NXP B.V., Eindhoven (NL)

( * ) Notice: Subject to any disclaimer, the term of this patent is extended or adjusted under 35 U.S.C. 154(b) by 161 days.

(21) Appl. No.: 18/545,104

(22) Filed: Dec. 19, 2023

(65) Prior Publication Data

US 2025/0202757 A1 Jun. 19, 2025

(51) Int. Cl.
*H04L 27/38* (2006.01)
*H03M 1/12* (2006.01)

(52) U.S. Cl.
CPC .............. *H04L 27/38* (2013.01); *H03M 1/12* (2013.01)

(58) Field of Classification Search
CPC ....... H03M 1/12; H03M 1/1225; H04L 27/38; H04B 1/16
See application file for complete search history.

(56) References Cited

U.S. PATENT DOCUMENTS

| | | |
|---|---|---|
| 7,064,700 B1 | 6/2006 | Garrity et al. |
| 7,388,931 B1 | 6/2008 | Hsu et al. |
| 7,916,050 B1 | 3/2011 | Mujica et al. |
| 9,030,340 B1 | 5/2015 | Waltari |
| 9,281,834 B1 | 3/2016 | Waltari |
| 9,306,790 B1 | 4/2016 | Strode |
| 9,998,138 B1 | 6/2018 | Yang et al. |
| 10,110,409 B1 | 10/2018 | Kappes et al. |
| 2003/0165202 A1 | 9/2003 | Park |

(Continued)

OTHER PUBLICATIONS

Garrity, Doug; A Single Analog-to-Digital Converter That Converts Two Separate Channels (I and Q) in a Broadband Radio Receiver; IEEE Journal of Solid-State Circuits; Jun. 2008; pp. 1458-1469; vol. 43, No. 6; IEEE.

(Continued)

*Primary Examiner* — David S Huang

(57) ABSTRACT

A system and method to process received quadrature signals is presented. A received signal is processed into in-phase and quadrature components. A multiplexer alternately outputs the analog in-phase component signal and the analog quadrature component signal at the output terminal as a multiplexer output signal. An analog-to-digital converter digitizes the signals. A demultiplexer is configured to receive the digital output stream, and, at a frequency determined by a second control signal, alternately output the digital output stream at a first output terminal of the demultiplexer as a digital representation of the in-phase component signal and a second output terminal of the demultiplexer as a digital representation of the quadrature component signal. A filter system is configured to impose a one-half sampling period delay on at least one of the digital representation of the in-phase component signal and the digital representation of the quadrature component signal.

20 Claims, 12 Drawing Sheets

(56) References Cited

U.S. PATENT DOCUMENTS

2003/0215027 A1 * 11/2003 Yu ........................... H04L 27/00
                                                    375/316
2011/0057823 A1 * 3/2011 Harpe ................... H03M 1/125
                                                    341/155

OTHER PUBLICATIONS

Singh, Simran et al., "Digitally Enhanced Wideband I/Q Downconversion Receiver With 2-Channel Time-Interleaved ADCs," in IEEE Transactions on Circuits and Systems II: Express Briefs, Jan. 2016, pp. 29-33, vol. 63, No. 1.
Aurangozeb, "A Quad-Channel 11-bit 1-GS/s 40-mW Collaborative ADC Enabling Digital Beamforming for 5G Wireless," in IEEE Transactions on Microwave Theory and Techniques, Sep. 2019, pp. 3798-3820, vol. 67, No. 9.

* cited by examiner

GROUP DELAY

FREQUENCY: 0.8466724
GROUP DELAY: 2.25396

FREQUENCY: 0.8466724
GROUP DELAY: 1.74604

$h_I = [-3,15,32,0,-1]$
$h_Q = [-1,0,32,15,-3]$

1504

1502

MAGNITUDE RESPONSE (dB)

1404

1402

$h_I = [-3,15,32,0,-1]$
$h_Q = [-1,0,32,15,-3]$

SPECTRUM OF A SINGLE-SIDED 848kHz TONE SAMPLED WITH 13.56MHz WITH 36.9ns DELAY ON I CHANNEL
AFTER APPLYING $h_i$ = [-3,15,32,0,-1]; $h_q$ = [-1,0,32,15,-3]

QUADRATURE SIGNAL PROCESSOR USING SINGLE ANALOG-TO-DIGITAL CONVERTER UNIT

TECHNICAL FIELD

A quadrature analog to digital converter (ADCs) processor is configured to analyze analog quadrature signals and generate a corresponding digital output stream. And, more particularly, a quadrature baseband receiver utilizes a single ADC to convert both in-phase and quadrature components of a quadrature signal into corresponding in-phase and quadrature digital values.

BACKGROUND

In electronics, an analog-to-digital converter ("ADC") is a system that converts an analog signal, such as a radio waves received using an antenna, into a digital signal. An ADC may also provide an isolated measurement when implemented as an electronic device that converts an input analog voltage or current to a digital number representing the magnitude of the input voltage or current.

More specifically, an ADC converts a continuous–time and continuous-amplitude analog signal to a discrete-time and discrete-amplitude digital signal. Instead of continuously performing the conversion, an ADC does the conversion periodically, sampling the input signal at a sampling rate, thus limiting the allowable bandwidth of the input signal.

ADCs configured to convert continuous quadrature signals into corresponding I and Q digital signals typically rely upon two separate and independent ADC units configured to separately process and convert the in-phase and quadrature components of the input analog signal.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter of the application and uses of such embodiments. As used herein, the words "exemplary" and "example" mean "serving as an example, instance, or illustration." Any implementation or embodiment described herein as exemplary, or an example is not necessarily to be construed as preferred or advantageous over other implementations. Furthermore, there is no intention to be bound by any expressed or implied theory presented in the preceding technical field, background, or the following detailed description.

Typical quadrature signal RF receivers require two separate ADC units to convert both the I channel (i.e., the in-phase portion of the input signal) and the Q channel (i.e., the quadrature portion of the input signal) simultaneously. For many reasons, matching the operational characteristics (e.g., the gain, offset, and distortion) of the two ADC units can be difficult, with variations in the operational characteristics of both converters resulting in overall degraded system performance. Approaches for diminishing these variations can be expensive and difficult to implement and often result in both increases in the area, size, and cost of the overall RF receivers and increases in device current consumption.

Use of a single ADC unit can eliminate this ADC-level operational characteristic matching requirement as a single piece of hardware (namely the single ADC unit) is (re) used for digitizing both the I and Q channel. This can reduce overall system costs, as fewer components are required, which decreases overall system size/area while also improving system performance. Because a single ADC unit is utilized there are no ADC unit operational characteristic variations.

Figure 1:
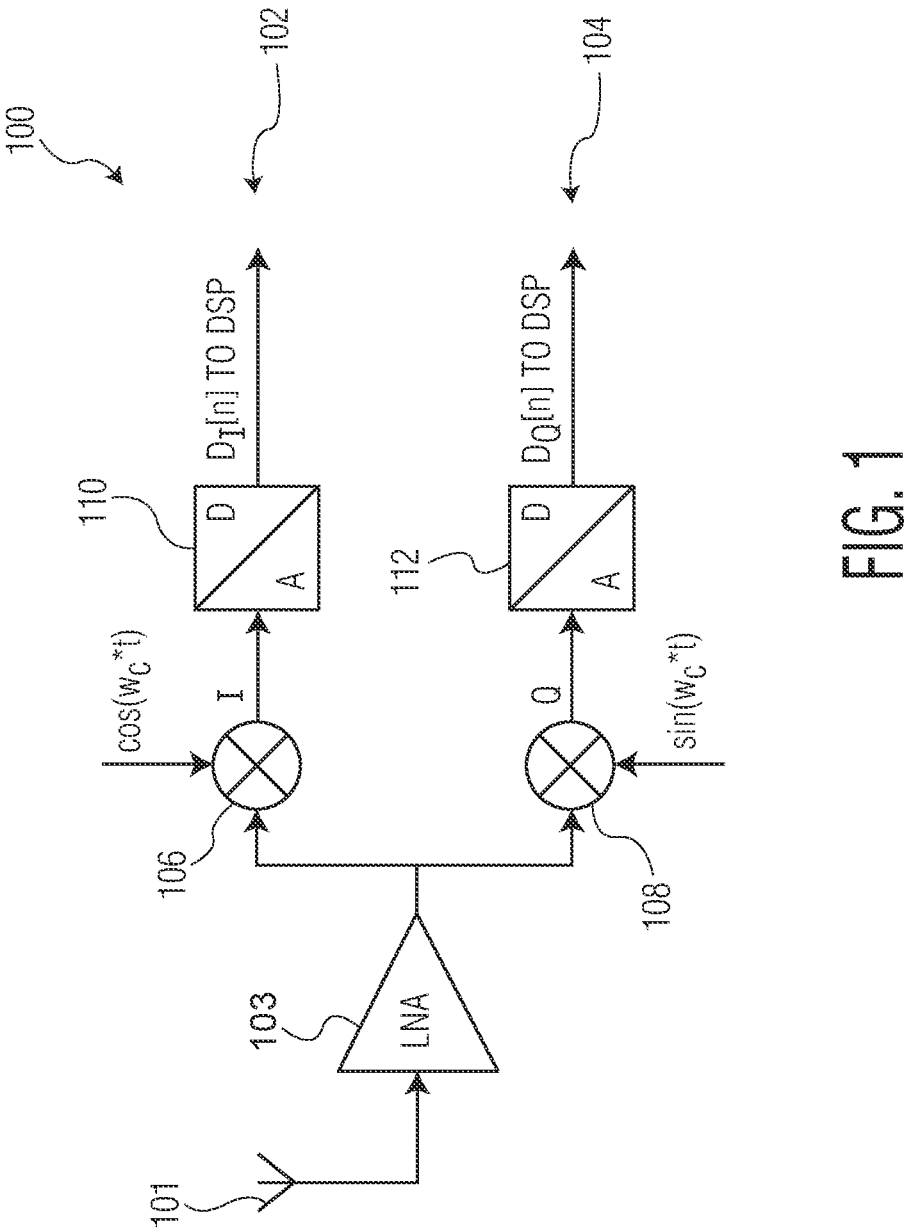
FIG. 1 is a block diagram of a conventional I/Q receiver.

To illustrate, FIG. 1 is a block diagram of a conventional I/Q receiver 100. In the conventional I/Q receiver 100, two different ADC devices run simultaneously, one for the I channel and the other for the Q channel. Specifically, I/Q receiver 100 is generally made up of two signal paths 102 and 104. Signal path 102 processes the in-phase portion of the input signal and signal path 104 processes the quadrature portion of the input signal. Each signal path 102, 104 includes independent ADCs to process their respective signals.

Specifically, I/Q receiver 100 receives an input quadrature signal at antenna 101 that is fed into low-noise amplifier 103, which is configured to boost an amplitude of the input signal. The output of low-noise amplifier 103 is split and fed into multipliers 106 and 108. Multiplier 106 is configured to combine the amplified input signal with the cosine of the carrier signal (cos($w_c$*t)) to extract the in-phase (I) portion of the input signal. Similarly, multiplier 108 is configured to combine the amplified input signal with the sine of the carrier signal (sin($w_c$*t)) to extract the quadrature (Q) portion of the input signal.

The in-phase portion of the input signal is supplied at an input of ADC 110, which is configured to periodically sample analog values from the receive input signal and generate, as output, a digital signal $D_I[n]$ that includes a stream of digital values equivalent to the sampled analog values.

At the same time, the quadrature portion of the input signal at an input of ADC 112, which is configured to periodically sample analog values from the receive input signal and generate, as output, a digital signal $D_Q[n]$ that includes a stream of digital values equivalent to the sampled analog values.

In this conventional configuration, both ADCs 110 and 112 operate simultaneously to continuously sample their respective analog input signals and generate a stream of corresponding output digital values. ADCs 110 and 112 operate at a sampling rate governed by a target sampling rate over the overall I/Q receiver 100. Although this provide an effective approach for generating digital data stream for the I and Q portions of an input data signal, there is significant cost associated with this design. Additional components are required (i.e., the second ADC), which increases device cost as well as size/area. Additionally, to the extent there is any gain mismatch between ADCs, additional circuit components and signal processing may be required to correct that mismatch.

In the present disclosure, an ADC configured to process quadrature signals (referred to herein as an I/Q ADC) is provided that exploits reuse of the ADC unit (e.g., the sampling capacitor, comparator, and digital components of a single charge redistribution (CR) successive approximation register (SAR) CR-SAR ADC unit) to achieve digital conversion of both I and Q channels in an interleaved manner. This approach can increase I and Q channel gain matching by reusing the analog conversion subsystem for each channel, while relying on additional digital post-processing to compensate for known phase-mismatch due to the shifted sample moments in an interleaved sampling system. Additionally, the I/Q receiver can have a reduced cost and device size/area due to the use of only a single ADC compared to conventional receivers that require two separate ADC systems.

Figures 2, 3:
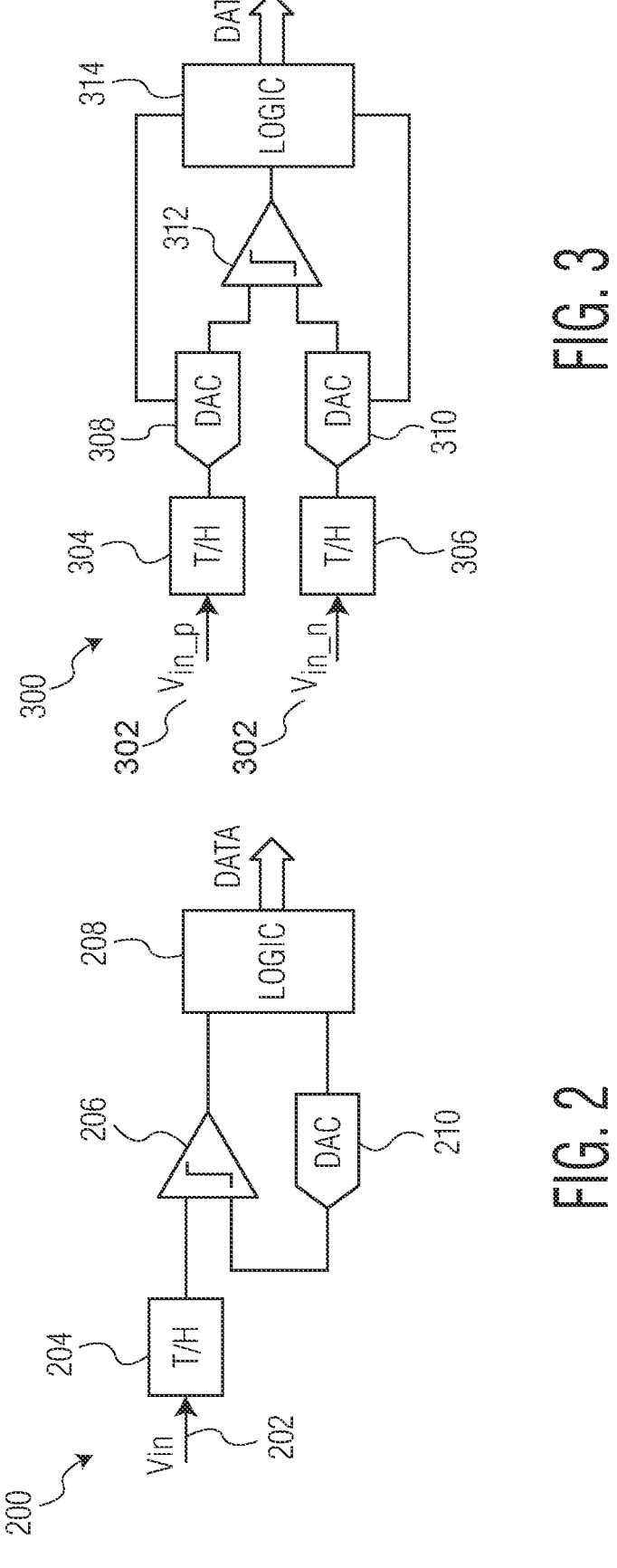
FIG. 2 depicts a signal ended SAR ADC.
FIG. 3 depicts a differential SAR ADC.

To illustrate, FIG. 2 depicts SAR ADC 200. SAR ADC 200 includes an input terminal 202 configured to receive an input signal. The input signal is supplied to track and hold component 204, which is configured to sample the input analog signal and generate an output signal that is held or maintained for a period of time. The output of track and hold component 204 is supplied to a comparator 206 that compares the input signal to a prior value output by DAC 210. The output of comparator 206 is supplied to logic block 208 that determines a digital output value based on the comparator 206 output. The output of SAR ADC 200 is fed back into comparator to enable successive value approximation.

FIG. 3 depicts a differential SAR ADC 300. As illustrated, differential SAR ADC 300 includes input terminals 302 configured to receive the positive ($V_{in\_p}$) and negative ($V_{in\_n}$) portions of an input signal. The respective portions of the input signal are supplied to respective track and hold components 304, 306, which are configured to sample their respective input analog signals and generate output signals that are held or maintained for a period of time. The outputs of track and hold components 304, 306, are supplied, respectively, to DACs 308, 310 that, in combination with comparator 312 and logic block 314, determines the direction of the approximation of DACs 308, 310. The output of SAR ADC 300 is generated by logic block 314 as an output data signal that approximates the input signal at input terminal 302.

The present interleaved I/Q CR-SAR ADC with digital delay-compensation generally comprises three elements that differ from a standard CR-SAR ADC—two sets of sampling switches with the appropriate control signals to implement an interleaving sampling algorithm and a digital post-processing system (e.g., implemented by an appropriately configured filter) to correct the skewed sample moments of the I and Q channel resulting from that interleaved sampling process.

Within the Nyquist band, I/Q mismatch can be compensated for by digital filters configured to re-construct a quadrature signal from the interleaved I and Q channel samples generated by a single ADC unit as if the I and Q channels were sampled at exactly the same time using a conventional receiver using dual parallel ADCs. In an embodiment, this output digital filter may be implemented as an all-pass flat magnitude response filter that is configured to provide 0.5 sample periods of frequency-independent delay on the previously-sampled I or Q channel. In this configuration, frequency independent group delay means linear phase-response and provides, effectively, a time delay function.

Figure 4:
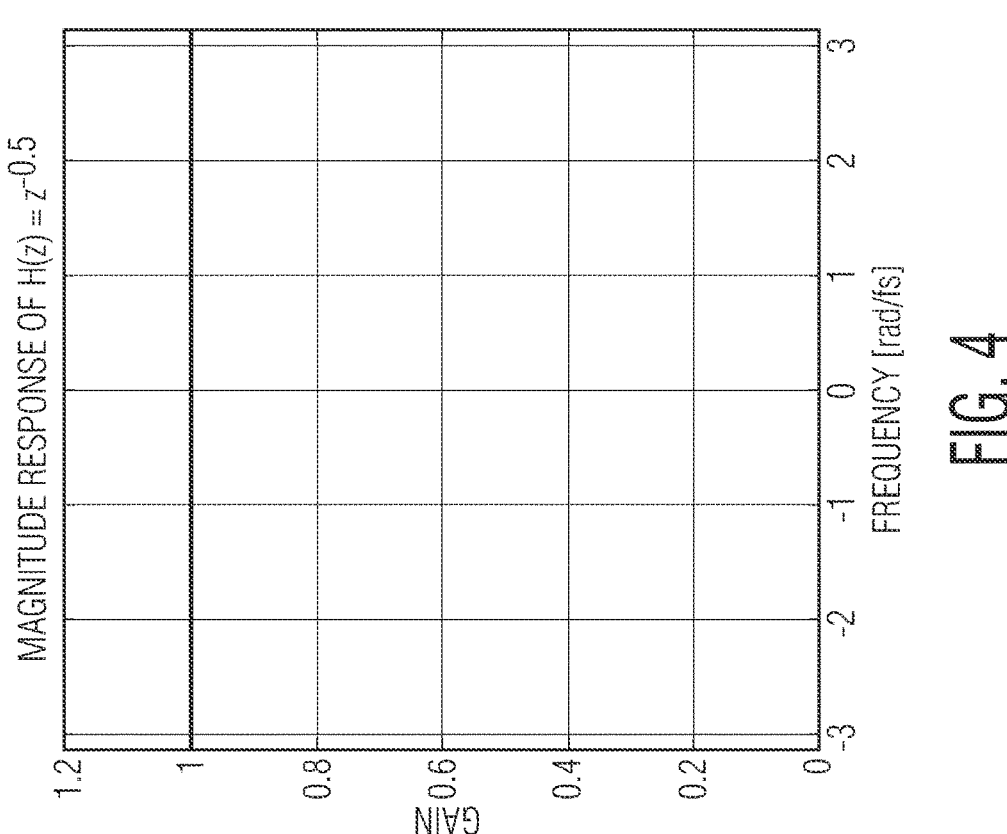
FIG. 4 depicts the desired magnitude response of a filter that may be used in the present I/Q ADC to reconstruct an output signal based upon interleaved I and Q channel samples.

For example, in conjunction with the present disclosure, FIG. 4 depicts the desired phase and magnitude response of a filter that may be used in the present I/Q ADC to reconstruct an output signal based upon interleaved I and Q channel samples. Specifically, FIG. 4 shows an ideal filter response to may be applied to an interleaved ADC output to re-construct a signal that is equivalent to a signal that would have been sampled by a conventional receiver running two parallel ADCs simultaneously. A filter having the depicted characteristics may be applied only on one channel (other schemes described further below illustrate filters to be applied on two channels for practical reasons).

Figure 5:
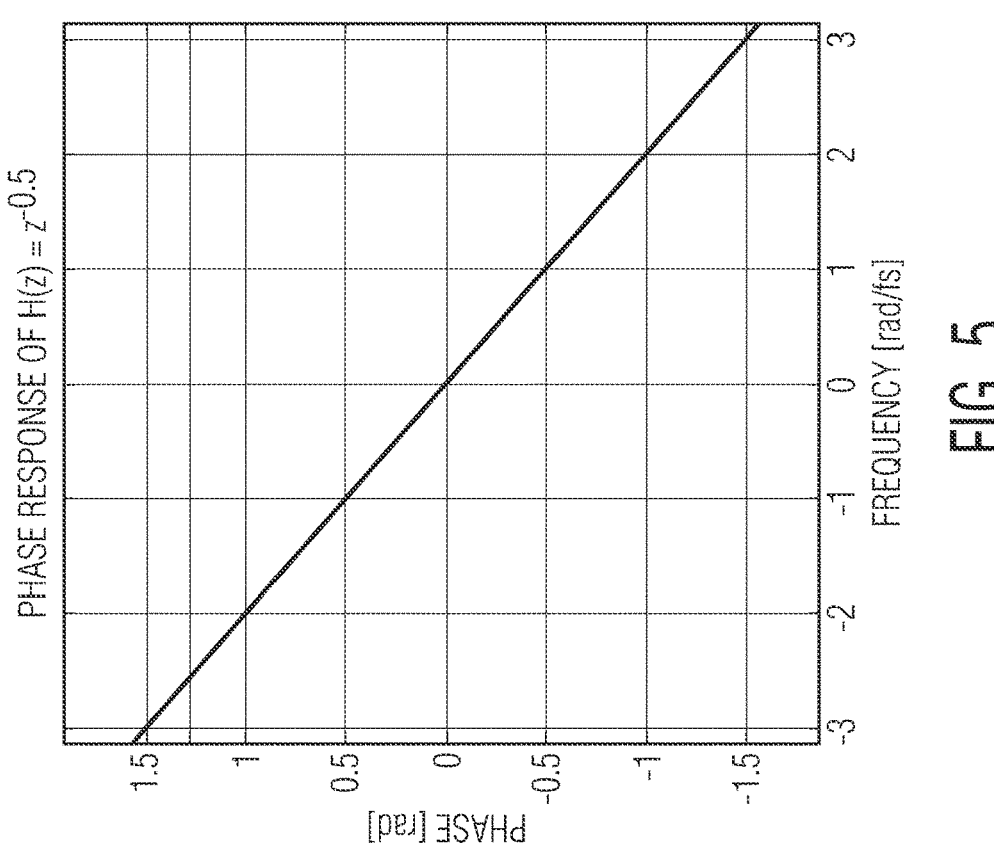
FIG. 5 depicts the phase response of the filter that may be used in the present I/Q ADC to reconstruct an output signal based upon interleaved I and Q channel samples.

As illustrated by FIG. 4, the magnitude response of the filter (vertical axis) does not change with frequency (horizontal axis). FIG. 5 depicts the phase response of the filter that may be used in the present I/Q ADC to reconstruct an output signal based upon interleaved I and Q channel samples. As illustrated, the phase response (vertical axis) of the filter is not uniform across frequency (horizontal axis). This phase response is configured to implement a 0.5 sample period frequency-independent delay on the previously-sampled I or Q channel to account for the interleaved samples of the I and Q channels to generate, effectively, a non-interleaved output signal.

Figure 6:
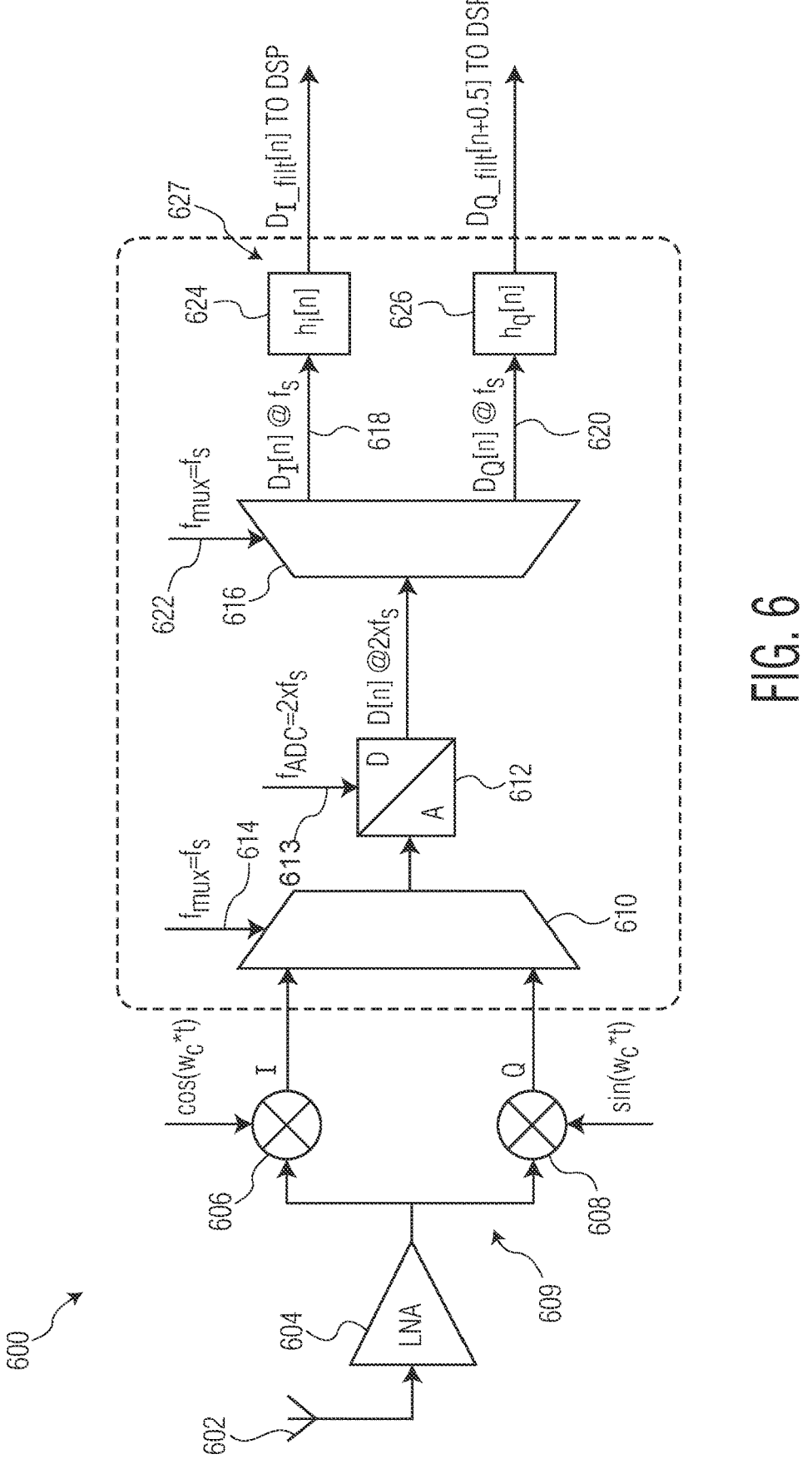
FIG. 6 depicts an interleaved I/Q receiver configured to convert analog I and Q input signals into corresponding digital output streams using a single ADC.

Given these conditions, FIG. 6 depicts an interleaved I/Q receiver 600 configured to convert analog I and Q input signals into corresponding digital output streams using a single ADC processing system. I/Q receiver 600 includes an input 602 (e.g., an antenna) configured to receive an analog signal (e.g., a radio frequency signal) comprising an in-phase (I) and quadrature (Q) components.

The signal is fed into low-noise amplifier 604, which is configured to boost an amplitude of the input signal. The output of low-noise amplifier 604 is split and fed into multipliers 606 and 608, which operates as decoder 609 configured to process the amplified quadrature signal into separate I and Q components. Specifically, multiplier 606 is configured to combine the amplified input signal with the cosine of the carrier signal (cos($w_c$*t)) to extract the in-phase (I) portion of the input signal. Similarly, multiplier 608 is configured to combine the amplified input signal with the sine of the carrier signal (sin($w_c$*t)) to extract the quadrature (Q) portion of the input signal.

The in-phase portion of the input signal is supplied at a first input of multiplexer 610. The quadrature portion of the input signal is supplied at a second input of multiplexer 610. Multiplexer 610 is configured to alternate between output-ting the I portion of the signal received at the first input and the Q portion of the input signal received at the second input to ADC unit 612 at a frequency of a control signal received at control input 614. In the present interleaved I/Q receiver 600 the control signal has a frequency $f_{mux}$ equal to the sampling frequency $f_s$ of interleaved I/Q receiver 600.

The output of multiplexer 610 is supplied to ADC unit 612, which is configured to sample the analog input signal (either I or Q signal) and convert the analog value of that input signal into a digital output signal having a value that is the digital equivalent to the analog value of the input signal. ADC unit 612 may be configured in accordance with SAR ADC 200 of FIG. 2 or SAR ADC 300 of FIG. 3. ADC unit 612 is configured to run at a sampling rate determined by a frequency of a control signal received at control input 613. In the present interleaved I/Q receiver 600 the control signal has a frequency $f_{ADC}$ equal to two times the sampling frequency $f_s$ of interleaved I/Q receiver 600.

In various embodiments, ADC unit 612 may be imple-mented as a CR-SAR ADC, though interleaved I/Q receiver 600 may be implemented using other types of ADC units.

The digital signal D[n] output by ADC unit 612 has a clock frequency equal to twice the sampling frequency of interleaved I/Q receiver 600. Furthermore, the values of the digital signal D[n] alternate between digital values repre-sentative of the I signal (i.e., the digitized values based on the signal received from multiplier 606) and digital values representative of the Q signal (i.e., the digitized values based on the signal received from multiplier 608). The signal D[n] is supplied to a single input of demultiplexer 616.

Demultiplexer 616 is configured to alternately output the input signal D[n] received at the single input of demulti-plexer 616 at one of the two output terminals 618, 620 of demultiplexer 616. The rate at which demultiplexer 616 switches between outputting the signal D[n] at output ter-minals 618, 620 is determined by a frequency of a control signal received at control input 622. In the present inter-leaved I/Q receiver 600 the control signal has a frequency $f_{mux}$ equal to the sampling frequency $f_s$ of interleaved I/Q receiver 600.

In this configuration, demultiplexer 616, relying on the clock signal received at input 622, is configured to output the digital values representative of the I signal at output terminal 618 and the digital values representative of the Q signal at output terminal 620. As such, the output signals at output terminals 618 and 620 have a frequency that is ½ of the frequency of the input signal received by demultiplexer 616 (i.e., a frequency of $f_s$).

The I digital signal having frequency $f_s$ at output terminal 618 is supplied to filter 624. Because demultiplexer 616 is configured to selectively output signals at output terminals 618 and 620, the signal at each output terminal 618 and 620 will be a signal half the time and a held version of that signal. Accordingly, filter 624 is configured to receive the output signal from output terminal 618 and hold that value (e.g., via use of registers within demultiplexer 616) for an additional half clock cycle (i.e., a period equal to $fs^{-1}/2$) so that the output signal is effectively held for the half clock-cycle during which the output at terminal 618 is null.

The Q digital signal having frequency $f_s$ at output terminal 620 of demultiplexer 616 is supplied to filter 626. Filter 626 outputs the filtered signal $D_{Q\_filt}$[n].

Because the digital values being output by demultiplexer 616 at output terminals 618, 620 are interleaved, they are each offset from one another by a ½ of a sampling period, where a sampling period is equal to $f_s^{-1}$. To deinterleave the two signals output by demultiplexer 616, therefore, one of filter 624 and filter 624 of an output filter system 627 is configured to delay its output signal by a ½ sampling period. This ½ sampling period offset implemented by one of filter 624 and filter 624 of filter system 627 effectively realigns the I and Q digital values being output by I/Q receiver 600.

The filtered and deinterleaved digital signals $D_{I\_filt}$[n] and $D_{Q\_filt}$[n] can be separately output by interleaved I/Q receiver 600 and supplied, for example, to a digital signal processor for processing.

Figure 7:
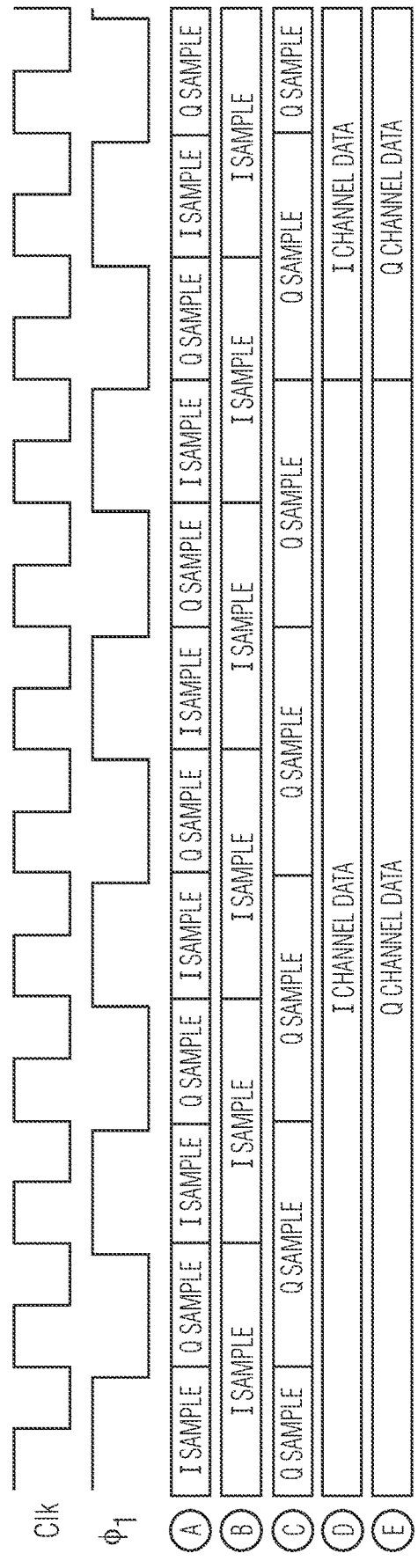
FIG. 7 depicts a signal timing scheme for interleaved I/Q receiver 600 of FIG. 6.

FIG. 7 depicts a signal timing scheme for interleaved I/Q receiver 600 of FIG. 6. The first signal, Clk, represents the clock signal of interleaved I/Q receiver 600, which is equivalent to two times the sampling frequency $f_s$ of inter-leaved I/Q receiver 600. The signal $1 is equivalent to a signal having frequency $f_s$.

The timing diagram A of FIG. 7 represents the digital signal D[n] which alternates between I and Q values at a frequency Clk (i.e., 2*$f_s$). This generally represents the output of ADC unit 612 of interleaved I/Q receiver 600.

Timing diagrams B and C of FIG. 7 represent the signals output at output terminals 618 and 620 of demultiplexer 616 of interleaved I/Q receiver 600. As depicted, these two signals are offset from one another by 1 clock cycle, which is ½ of the period of φ1 or 0.5 sampling periods of I/Q receiver 600.

Finally, timing diagrams D and E of FIG. 7 represent the signals output by filter 624 and filter 626, which represent the two digital I and Q output signals of interleaved I/Q receiver 600. As illustrated, these two signals are deinter-leaved so that the outputs signals are fully synchronized.

When sampling and digitizing a quadrature signal, I/Q mismatch may result from the interleaved sampling of the input signal (e.g., and RF input signal received at input 602 of interleaved I/Q receiver 600 of FIG. 6). To illustrate, an example is presented for a system having a single-sided 848 kHz tone, sampling at 13.56 MS/s on each channel. Due to the linear-phase response of a constant group delay, the loss in wanted signal level and the increase in unwanted signal can get worse as frequency of the input signal approaches the Nyquist frequency of the I/Q ADC.

Figure 8:
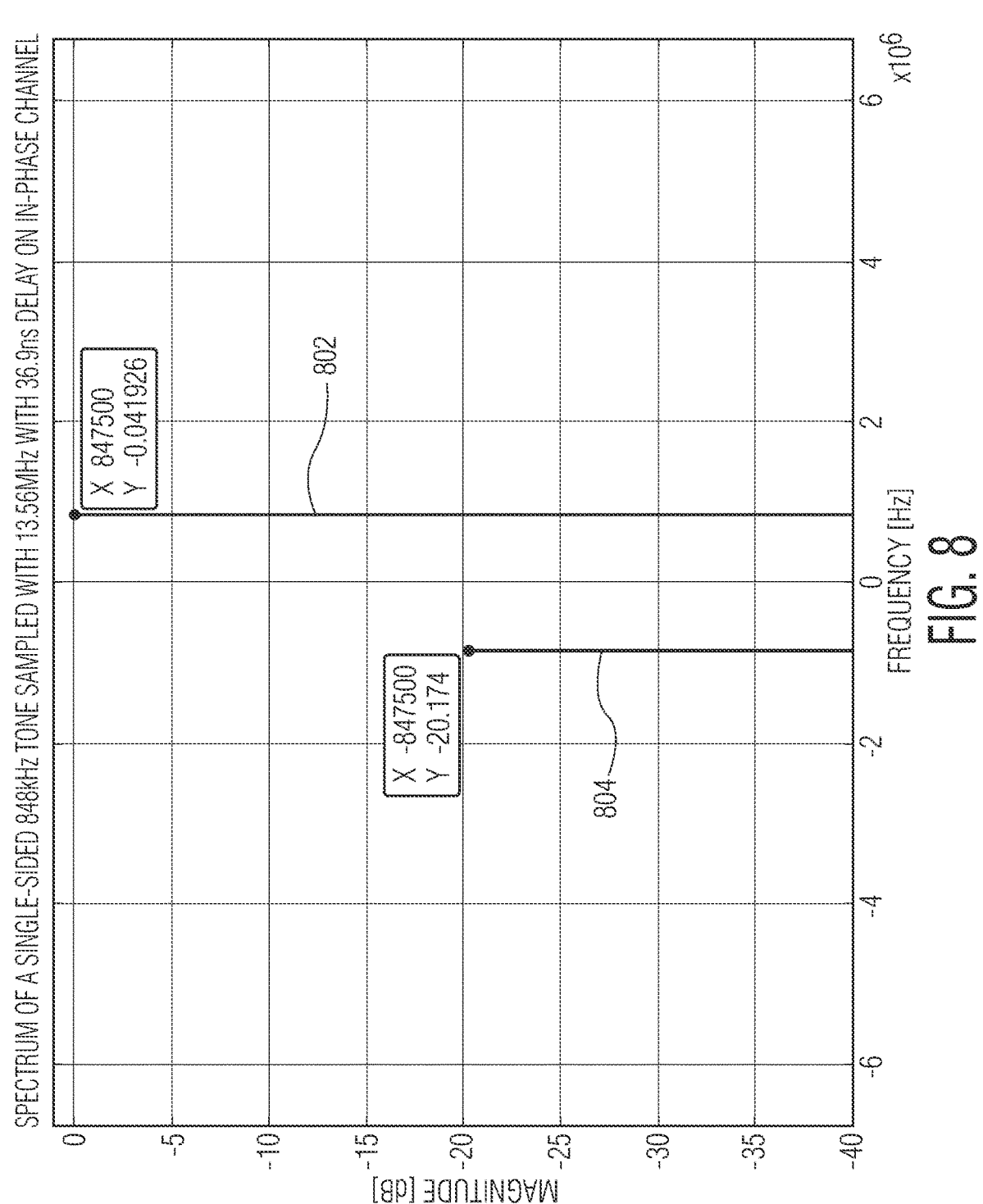
FIG. 8 is a graph depicting the spectrum of an output of an example interleaved I/Q receiver configured in accordance with the present disclosure.

FIG. 8 is a graph depicting the spectrum of the output of an I/Q receiver operating using a single sided, 848 kHz input signal, which in a (ideal) conventional, parallel I/Q sampling system (i.e., using two separate ADCs for I and Q channels) would only create one discrete tone at 848 kHz. However, the present interleaving approach can create an image at −848 kHz due to the phase/delay mismatch between I and Q channels. To reduce/remove that image again and recover an equivalent digital signal as conventional parallel ADC systems, digital correction filters may be introduced, as described below. As illustrated in FIG. 8, the desired output signal, represented by trace 802 has an output magnitude (vertical axis) of about 0.042 dB, representing a signal loss of around 0.042 dB at a positive frequency (in this example, a frequency of about 0.8 MHz). The output spectrum also includes a non-trivial and unwanted tone—the so-called "image" (represented by trace 804) having a magnitude of around −20.174 dB and a frequency that is the negative of the frequency of the wanted signal (i.e., about −0.8 MHz).

The magnitude of the unwanted tone trace 804 in the sampling process depicted in FIG. 8 can be mitigated (e.g., its magnitude can be reduced) by applying a 0.5 sampling-period delay on the earlier-sampled channel in the digital domain to enabling the unwanted tone trace 802 to be diminished within the Nyquist-band. With a theoretically perfect filter, the unwanted tone trace 802 can be removed completely from the output signal.

However, because a perfect all-pass filter with constant gain and linear phase requires in infinite impulse response of the filter (e.g., "brick wall" filters), most practical implementations suffer from inaccuracy in either phase or magnitude response (or both). Thus, only applying a filter on the earlier-sampled channel (and the ideal filter depicted in FIGS. 4 and 5 may be sufficient) is not always the best choice, since the resulting phase or magnitude inaccuracy applied on only one channel can again introduce I/Q mismatch leading to unwanted signals in the I/Q ADC's output signal. Furthermore, it can be beneficial to combine any delay compensation filter with other filters (e.g., decimation filters) in the signal processing chain to reduce processing overhead. In contrast, in accordance with the present disclosure, no new filters need to be introduced, in most digital processing chains, but only a delay-difference of 0.5 sampling-periods needs to be established between the filters applied in I and Q channel (see, for example, the description above with respect to filters 624 and 626 of FIG. 6).

One approach for calculating filter coefficients that result in 0.5 sampling-period delay compensation is to choose a filter kernel for one channel (e.g., $h_i[n]$) for the I-channel (this might be the coefficients from an already existing filter in the digital receiver chain) and to interpolate this filter kernel by a factor of two and delaying the interpolation result by one sample and downsample again. The output then generates coefficients for a $2^{nd}$ filter $h_q[n]$. Coefficients $h_i[n]$ and $h_q[n]$ can then be applied to filters 624 and 626 of I/Q receiver 600 of FIG. 6.

Figure 9:
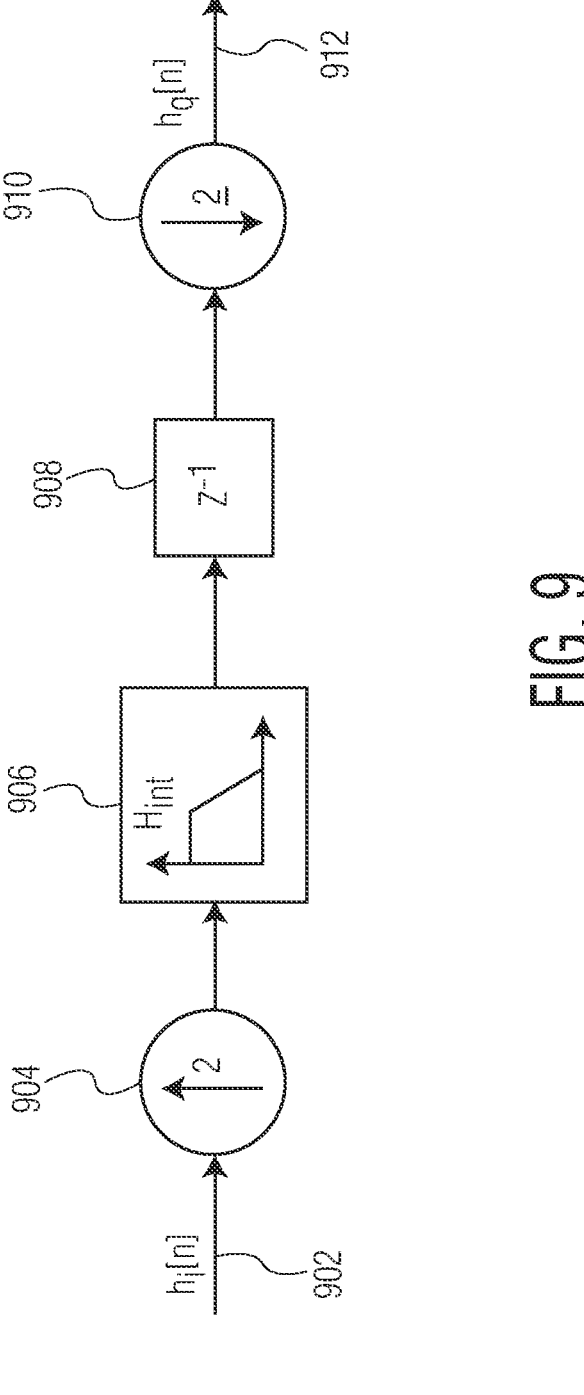
FIG. 9 is a block diagram depicting steps in a process of determining filter coefficients of a filter configured to implement a 0.5 sampling-period delay.

To illustrate, FIG. 9 is a block diagram depicting steps in a process 900 of determining coefficients for a filter configured to implement a 0.5 sampling-period delay. Process 900 may be utilized to generate filter coefficients for a filter providing the functionality of filter 624 or filter 626 of interleaved I/Q receiver 600 of FIG. 6 to achieve the desired 0.5 sampling period offset between I and Q channel (to compensate for the 0.5 sampling delay of the interleaved ADC).

Process 900 includes an input stage 902 configured to receive the filter kernel $h_i[n]$.

The filter kernel $h_i[n]$ is then upsampled by a factor of 2 by upsampling step 904 to interpolate filter coefficients with 0.5 delay to the original filter kernel. The upsampled filter kernel is then filtered through a low pass filter step 906 to remove the alias created by the upsampling. The filtered signal is then delayed by delay step 908 by a single sample (i.e., $Z^{-1}$). By delaying the upsampled filter coefficients (which were previously upsampled by a factor of two by upsampling step 904) by a single sample, this process effectively delays the original input filter hi[n] by 0.5 sampling periods. That delayed filter kernel is then downsampled by a factor of two by downsampling step 910 to return to its original sampling frequency (i.e., the frequency of the original input signal) and output coefficients to be used by filter 626 are output at step 912, with a 0.5 sampling period delay. Note that the role of hi[n] and $h_q[n]$ can be swapped, depending upon which channel was sampled earlier in time.

The filtering/delay scheme implemented by filters 624 and 626 using the modified filter coefficients generated according to process 900 of FIG. 9 is configured to implement a 0.5 sampling period delay on the input signal h[n]. However, depending on the interpolation effort assumed by low pass filter step 906, the magnitude response of the filter generated by process 900 can differ between the I and Q channels potentially creating residual I/Q mismatch. Depending on system requirements, more or less effort can be spent on implementation and operation of the interpolation filter and resulting filter calculations. For example, in accordance with the present example, a simple filter may be applied using coefficients $h_i=[3, 6, 3]$ for filtering the I channel and $h_q=[1, 5, 5, 1]$ for filtering the Q channel for a 13.56 MS/s data-stream to achieve the desired offset.

Figures 10, 11:
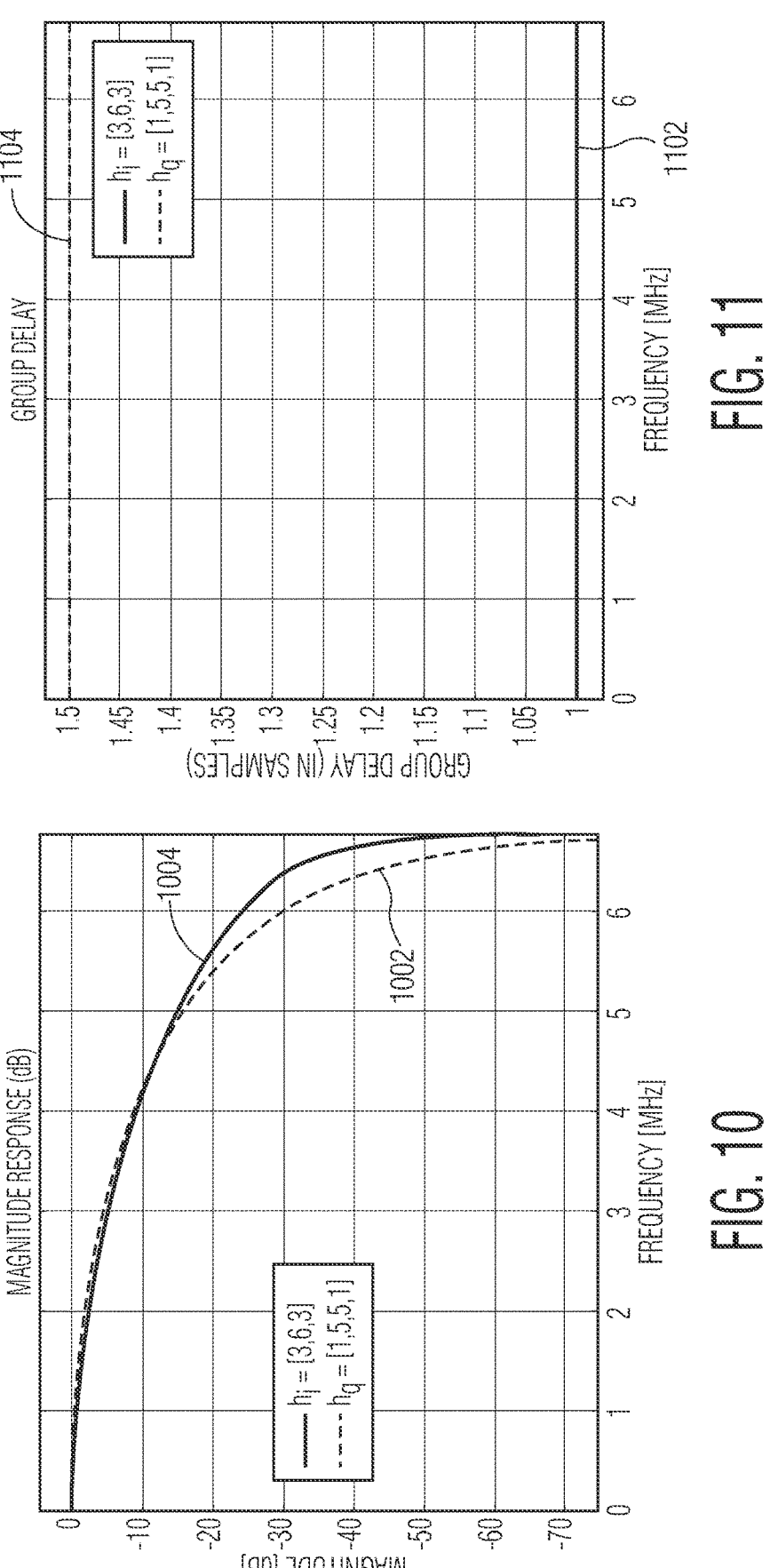
FIG. 10 is a graph depicting the magnitude response of a filter configured in accordance with this model for the I (trace 1002) and the Q (trace 1004) channel signals.
FIG. 11 is a graph depicting the group delay of a filter configured in accordance with this model for the I (trace 1102) and the Q (trace 1104) channel signals.

FIG. 10 is a graph depicting the magnitude response of a filter configured in accordance with this model for the I (trace 1002) and the Q (trace 1004) channel signals. The horizontal axis represents frequency and the vertical axis represents the magnitude output of the filter. FIG. 11 is a graph depicting the group delay of a filter configured in accordance with this model for the I (trace 1102) and the Q (trace 1104) channel signals. The horizontal axis represents frequency and the vertical axis represents group delay. As illustrated by FIGS. 10 and 11, the filter configuration exhibits the desired linear phase response with constant 0.5 sample-periods delay difference between I and Q, however due to the simplified interpolated filter $h_q$ (i.e., with a relatively small number of coefficient values), the magnitude responses do not match perfectly, resulting in some remaining I/Q mismatch. The mismatch typically increases at higher frequencies, as illustrated by FIG. 10.

Figure 12:
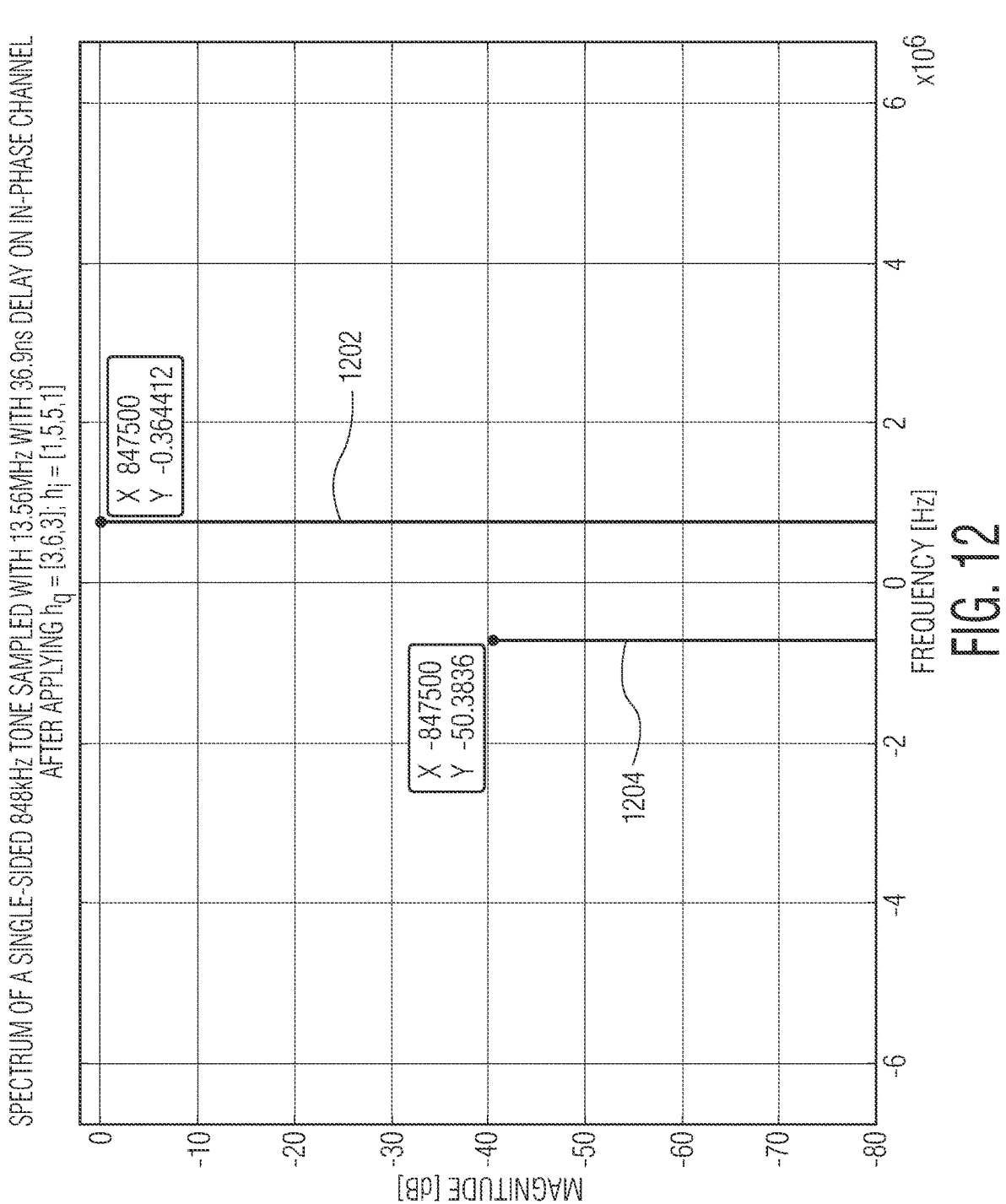
FIG. 12 is a graph depicting the spectrum of the output of an I/Q receiver configured in accordance with the present disclosure, an incorporating a filter on one or the I and Q channels.

Even with that mismatch in the magnitude response, when applying the present filter design to the example described above (i.e., with an 848 kHz single-sided input tone) significant improvement can be realized on the image rejection. To illustrate, FIG. 12 is a graph depicting the spectrum of the output of the interleaved I/Q receiver associated with an 848 KHZ single-sideband input signal and employing I and Q channel filters configured in accordance with the present example. As illustrated, the output spectrum includes desired signal 1202 and shows a reduced amplitude of the unwanted image (represented by trace 1204) having a magnitude of around −50.38 dB, compared to around −20 dB in FIG. 8 The magnitude of the unwanted tone (trace 1204) in the example depicted in FIG. 12 using the present filter design represents an improvement (e.g., about a 30 dB reduction in the magnitude of the unwanted tone trace 1204).

This filtering approach matches the linear phase (frequency-independent group-delay) target of the compensation filter, while allowing some gain mismatch between I and Q channels. In an alternative implementation, the opposite approach may be utilized in which the gain between I/Q is matched but allows some remaining mismatch on the phase.

Figure 13:
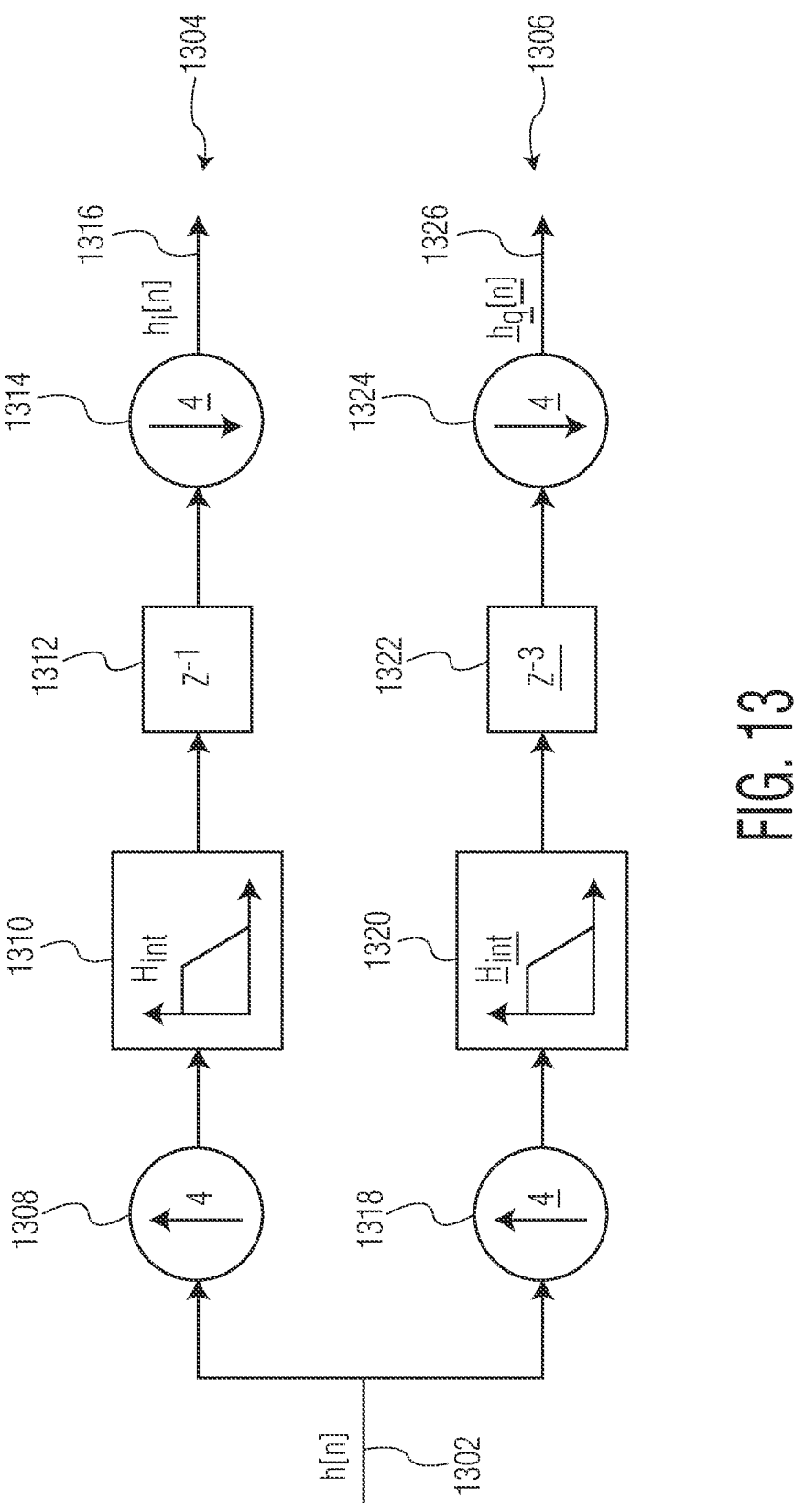
FIG. 13 is a block diagram depicting steps in a process of determining filter coefficients configured to implement a 0.5 sampling-period delay on separate I and Q channels.

FIG. 13 is a block diagram depicting steps in a method configured to determine coefficients for implementing a 0.5 sampling-period delay on separate I and Q channels. The method of FIG. 13 may be used to generate filters configured to provide the functionality of filter 624 and filter 626 of interleaved I/Q receiver 600 of FIG. 6. Specifically, process 900 includes an input stage 1302 configured to receive the input filter kernel h[n] demultiplexer 616. The filter kernel is then separately along two paths—I channel path 1304 and the Q channel path 1306.

On the I channel path 1304, the filter kernel is upsampled by a factor of 4 by upsampling step 1308. The upsampled filter kernel is then filtered through a low pass filter step 1310 to remove the alias created by upsampling. The filtered signal is then delayed by delay step 1312 by a single sample (i.e., $Z^{-1}$). By delaying the upsampled filter coefficients (which were previously upsampled by a factor of four by upsampling step 1308) by a single sample, this process effectively delays the original input filter s hi[n] by 0.25 sampling periods. That delayed filter kernel is then downsampled by a factor of four by downsampling step 1314 (to return it to its original sampling frequency—the frequency of the original input signal) and output coefficients are generated at step 1316.

On the Q channel path 1306, the filter kernel is upsampled by a factor of 4 by upsampling step 1318. The upsampled filter kernel is then filtered through a low pass filter step 1320 to remove the alias created by upsampling. The filtered signal is then delayed by delay step 1322 by three samples (i.e., $Z^{-3}$). By delaying the upsampled filter coefficients (which were previously upsampled by a factor of four by upsampling step 1308) by three samples, this process effectively delays the filter coefficients $h_q[n]$ by 0.75 sampling periods. That delayed filter kernel is then downsampled by a factor of four by downsampling step 1324 (to return it to its original sampling frequency—the frequency of the original input signal) and output coefficients are generated at step 1326.

The filtering/delay scheme implemented by the method of FIG. 13 is configured to implement a 0.5 sampling period delay between of the I and Q channels. Specifically, for the I channel path 1304, a 0.25 sample period delay is implemented while on the Q channel path 1306 a 0.75 sample period delay is implemented resulting in the desired 0.5 sample period offset. If the filter kernel h[n] used at the input to the method of FIG. 13 is linear-phase, then the resulting impulse response filter coefficients on the I-channel (i.e., $h_i[n]$) and the Q-channel (i.e., $h_q[n]$) are time-reversed versions from each other which, in an FIR filter implementation, can result in the same magnitude response independent on the rounding errors added to the coefficients.

Figures 14, 15:
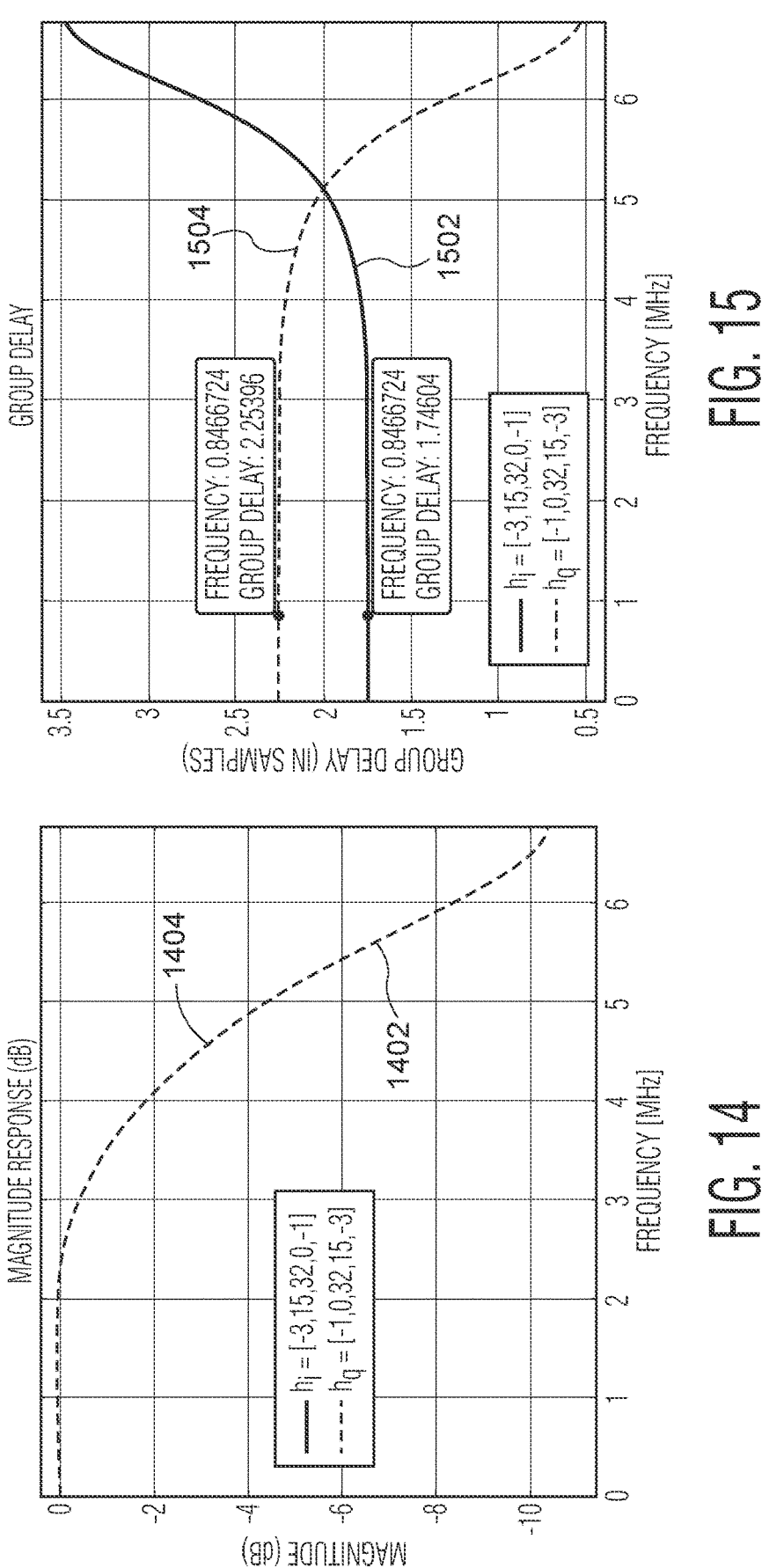
FIG. 14 is a graph depicting the magnitude response of a filter configured in accordance with this model for the I channel (trace 1402) for the present example with filter coefficients hi=[−1, 0, 32, 15, −3] and the Q channel (trace 1004) with filter coefficients $h_q$=[−3, 15, 32, 0, −1] (i.e., the inverse of the coefficients of the I channel filter).
FIG. 15 is a graph depicting the group delay of a filter configured in accordance with this model for the I (trace 1102) and the Q (trace 1104) channel signals.

FIG. 14 is a graph depicting the magnitude response of a filter configured in accordance with this model for the I channel (trace 1402) for the present example with filter coefficients $h_i=[-1, 0, 32, 15, -3]$ and the Q channel (trace 1404) with filter coefficients $h_q=[-3, 15, 32, 0, -1]$ (i.e., the inverse of the coefficients of the I channel filter). The horizontal axis represents frequency, and the vertical axis represents the magnitude output of the filter. FIG. 15 is a graph depicting the group delay of a filter configured in accordance with this model for the I (trace 1502) and the Q (trace 1504) channel signals. The horizontal axis represents frequency and the vertical axis represents group delay.

As illustrated by FIGS. 14 and 15, due to chosen length of the filters and the binary optimized value of the coefficients, the group delay of FIG. 15 is not perfectly compensated and especially at higher frequency starts to deviate significantly from the desired 0.5 sampling periods. Similar to the previous approach, the attenuation of the filter at higher frequency helps to reduce the unwanted tones created by the added phase-mismatch. And, again, the phase and group-delay response can be arbitrarily improved, depending on requirements and effort spend in the digital system.

Figure 16:
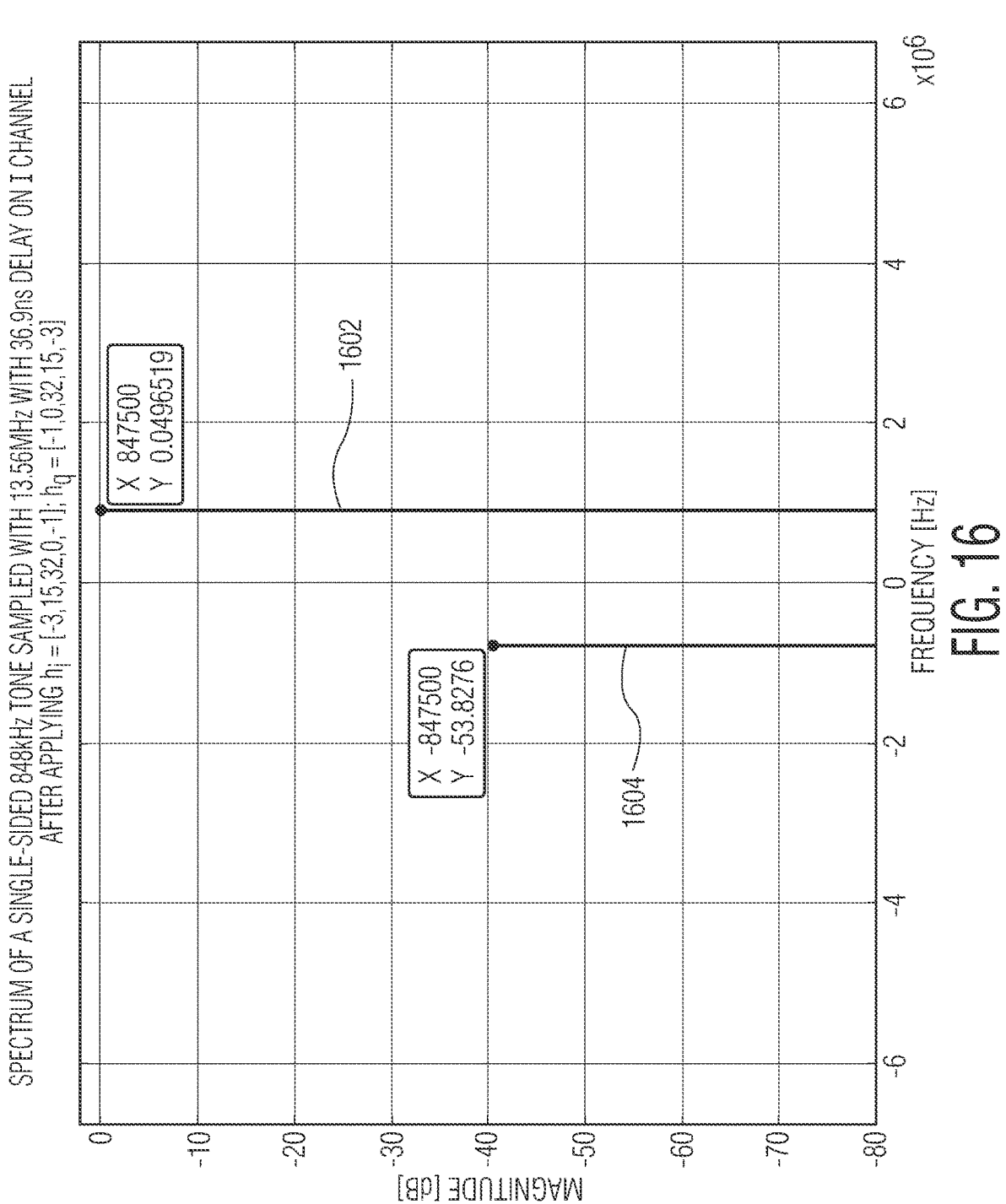
FIG. 16 is a graph depicting the spectrum of the output of an I/Q receiver configured in accordance with the present disclosure and including filters on both I and Q channels.

Even with that mismatch in the phase and group-delay response, when applying the present filter design to the example described above (i.e., with an 848 kHz single-sided input tone) significant improvement can be realized. To illustrate, FIG. 16 is a graph depicting the spectrum of the output of the interleaved I/Q receiver I/Q associated with an 848 kHz single-sideband input signal and employing I and Q channel filters configured in accordance with the present example. As illustrated, the output spectrum shows a desired signal 1602 and a reduced amplitude of the unwanted image (represented by trace 1604) having a magnitude of around—53.8 dB, compared to around—20 dB in the FIG.

The magnitude of the unwanted tone trace 1604 in the example depicted in FIG. 16 using the present filter design represents an improvement (e.g., about a 33 dB reduction in the magnitude of the unwanted tone trace 1604) over the results depicted in FIG. 8).

In some aspects, the techniques described herein relate to a system, including: an input terminal configured to receive a quadrature signal; a decoder configured to process the quadrature signal into an analog in-phase component signal and an analog quadrature component signal; a first multiplexer coupled to the decoder and including a first output terminal, the first multiplexer being configured to: receive the analog in-phase component signal, receive the analog quadrature component signal, receive a first control signal, and at a frequency determined by the first control signal, alternately output the analog in-phase component signal and the analog quadrature component signal at the output terminal as a first multiplexer output signal; an analog-to-digital converter configured to: sample analog values from the first multiplexer output signal, convert the analog values into corresponding digital values, and output the digital values as a digital output stream; a second multiplexer connected to the analog-to-digital converter, the second multiplexer being configured to: receive the digital output stream, receive a second control signal, and at a frequency determined by the second control signal, alternately output the digital output stream at a first output terminal of the second multiplexer as a digital representation of the in-phase component signal and a second output terminal of the second multiplexer as a digital representation of the quadrature component signal; and a filter system configured to impose a one-half sampling period delay on at least one of the digital representation of the in-phase component signal and the digital representation of the quadrature component signal, wherein a sampling period is equal to an inverse of a frequency of the first control signal.

In some aspects, the techniques described herein relate to a system, including: a first input configured to receive an analog in-phase component signal of a quadrature signal; a second input configured to receive an analog quadrature component signal of the quadrature signal; a first multiplexer including a first output terminal, the first multiplexer being configured to alternately output the analog in-phase component signal and the analog quadrature component signal at the output terminal as a first multiplexer output signal; an analog-to-digital converter configured to: sample analog values from the first multiplexer output signal, convert the analog values into corresponding digital values, and output the digital values as a digital output stream; and a demultiplexer connected to the analog-to-digital converter, the demultiplexer being configured to alternately output the digital output stream at a first output terminal of the demultiplexer as a digital representation of the in-phase component signal and a second output terminal of the demultiplexer as a digital representation of the quadrature component signal.

In some aspects, the techniques described herein relate to a method, including: receiving an analog in-phase component signal of a quadrature signal and an analog quadrature component signal of the quadrature signal; alternately outputting the analog in-phase component signal and the analog quadrature component signal as a first output signal; sampling analog values from the first output signal; converting the analog values into corresponding digital values; outputting the digital values as a digital output stream; and alternately output the digital output stream as a digital representation of the in-phase component signal and a digital representation of the quadrature component signal.

As will be appreciated by one skilled in the art, aspects of the present disclosure may be embodied as a system, process, method, and/or program product. Accordingly, various aspects of the present disclosure (e.g., the machine learning system) may take the form of an entirely hardware embodiment, an entirely software embodiment (including firmware, resident software, micro-code, etc.), or embodiments combining software and hardware aspects, which may generally be referred to herein as a "circuit," "circuitry," "module," or "system." Furthermore, aspects of the present disclosure may take the form of a program product embodied in one or more computer readable storage medium(s) having computer readable program code embodied thereon. (However, any combination of one or more computer readable medium (s) may be utilized. The computer readable medium may be a computer readable signal medium or a computer readable storage medium.)

A computer readable storage medium may be, for example, but not limited to, an electronic, magnetic, optical, electromagnetic, infrared, biologic, atomic, or semiconductor system, apparatus, controller, or device, or any suitable combination of the foregoing, wherein the computer readable storage medium is not a transitory signal per se. More specific examples (a non-exhaustive list) of the computer readable storage medium may include the following: an electrical connection having one or more wires, a portable computer diskette, a hard disk, a random access memory ("RAM"), a read-only memory ("ROM"), an erasable programmable read-only memory ("EPROM" or flash memory), an optical fiber, a portable compact disc read-only memory ("CD-ROM"), an optical storage device, a magnetic storage device, or any suitable combination of the foregoing. In the context of this document, a computer readable storage medium may be any tangible medium that can contain or store a program for use by or in connection with an instruction execution system, apparatus, controller, or device. Program code embodied on a computer readable signal medium may be transmitted using any appropriate medium, including but not limited to wireless, wire line, optical fiber cable, RF, etc., or any suitable combination of the foregoing.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, controller, or device.

The block diagrams in the figures illustrate architecture, functionality, and operation of possible implementations of circuitry, systems, methods, processes, and program products according to various embodiments of the present disclosure. In this regard, certain blocks in the block diagrams may represent a module, segment, or portion of code, which includes one or more executable program instructions for implementing the specified logical function(s). It should also be noted that, in some implementations, the functions noted in the blocks may occur out of the order noted in the figures. For example, two blocks shown in succession may, in fact, be executed substantially concurrently, or the blocks may sometimes be executed in the reverse order, depending upon the functionality involved.

Modules implemented in software for execution by various types of processors may, for instance, include one or more physical or logical blocks of computer instructions, which may, for instance, be organized as an object, procedure, or function. Nevertheless, the executables of an identified module need not be physically located together, but may include disparate instructions stored in different locations which, when joined logically together, include the module, and achieve the stated purpose for the module. Indeed, a module of executable code may be a single instruction, or many instructions, and may even be distributed over several different code segments, among different programs, and across several memory devices. Similarly, operational data (e.g., knowledge bases of adapted weights and/or biases described herein) may be identified and illustrated herein within modules, and may be embodied in any suitable form and organized within any suitable type of data structure. The operational data may be collected as a single data set, or may be distributed over different locations including over different storage devices. The data may provide electronic signals on a system or network.

These program instructions may be provided to one or more processors and/or controller(s) of a general-purpose computer, special purpose computer, or other programmable data processing apparatus (e.g., controller) to produce a machine, such that the instructions, which execute via the processor(s) of the computer or other programmable data processing apparatus, create circuitry or means for implementing the functions/acts specified in the block diagram block or blocks.

It will also be noted that each block of the block diagrams, and combinations of blocks in the block diagrams, can be implemented by special purpose hardware-based systems (e.g., which may include one or more graphics processing units) that perform the specified functions or acts, or combinations of special purpose hardware and computer instructions. For example, a module may be implemented as a hardware circuit including custom VLSI circuits or gate arrays, off-the-shelf semiconductors such as logic chips, transistors, controllers, or other discrete components. A module may also be implemented in programmable hardware devices such as field programmable gate arrays, programmable array logic, programmable logic devices, application specific ICs, microcontrollers, systems on a chip, general purpose processors, microprocessors, or the like.

Computer program code, i.e., instructions, for carrying out operations for aspects of the present disclosure may be written in any combination of one or more programming languages, including an object-oriented programming language such as Java, Smalltalk, Python, C++, or the like, conventional procedural programming languages, such as the "C" programming language or similar programming languages, or any of the machine learning software disclosed herein.

These program instructions may also be stored in a computer readable storage medium that can direct a computer system, other programmable data processing apparatus, controller, or other devices to function in a particular manner, such that the instructions stored in the computer readable medium produce an article of manufacture including instructions which implement the functions/acts specified in the block diagram block or blocks.

The program instructions may also be loaded onto a computer, other programmable data processing apparatus, controller, or other devices to cause a series of operational steps to be performed on the computer, other programmable apparatus or other devices to produce a computer implemented process such that the instructions which execute on the computer, other programmable apparatus, or other devices provide processes for implementing the functions/acts specified in the block diagram block or blocks.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

14

What is claimed is:

1. A system, comprising:
an input terminal configured to receive a quadrature signal;
a decoder configured to process the quadrature signal into an analog in-phase component signal and an analog quadrature component signal;
a first multiplexer coupled to the decoder and including a first output terminal, the first multiplexer being configured to:
receive the analog in-phase component signal,
receive the analog quadrature component signal,
receive a first control signal, and
at a frequency determined by the first control signal, alternately output the analog in-phase component signal and the analog quadrature component signal at the output terminal as a first multiplexer output signal;
an analog-to-digital converter configured to:
sample analog values from the first multiplexer output signal,
convert the analog values into corresponding digital values, and
output the digital values as a digital output stream;
a demultiplexer connected to the analog-to-digital converter, the demultiplexer being configured to:
receive the digital output stream,
receive a second control signal, and
at a frequency determined by the second control signal, alternately output the digital output stream at a first output terminal of the demultiplexer as a digital representation of the in-phase component signal and a second output terminal of the demultiplexer as a digital representation of the quadrature component signal; and
a filter system configured to impose a one-half sampling period delay on at least one of the digital representation of the in-phase component signal and the digital representation of the quadrature component signal, wherein a sampling period is equal to an inverse of a frequency of the first control signal;
wherein the filter system is configured to upsample at least one of the digital representation of the in-phase component signal and the digital representation of the quadrature component signal by a factor, delay the upsampled signal by a number of samples determined by the factor, and downsample the delayed signal by the factor.

2. The system of claim 1, wherein the filter system exhibits a linear phase-response to effect a time delay on an input signal to the filter system.

3. The system of claim 1, wherein the analog-to-digital converter includes a charge redistribution successive approximation analog-to-digital converter.

4. A system, comprising:
an input terminal configured to receive a quadrature signal;
a decoder configured to process the quadrature signal into an analog in-phase component signal and an analog quadrature component signal;
a first multiplexer coupled to the decoder and including a first output terminal, the first multiplexer being configured to:
receive the analog in-phase component signal,
receive the analog quadrature component signal,
receive a first control signal, and

15 at a frequency determined by the first control signal, alternately output the analog in-phase component signal and the analog quadrature component signal at the output terminal as a first multiplexer output signal;

an analog-to-digital converter configured to:

sample analog values from the first multiplexer output signal, convert the analog values into corresponding digital values, and output the digital values as a digital output stream;

a demultiplexer connected to the analog-to-digital converter, the demultiplexer being configured to:

receive the digital output stream, receive a second control signal, and at a frequency determined by the second control signal, alternately output the digital output stream at a first output terminal of the demultiplexer as a digital representation of the in-phase component signal and a second output terminal of the demultiplexer as a digital representation of the quadrature component signal; and a filter system configured to impose a one-half sampling period delay on at least one of the digital representation of the in-phase component signal and the digital representation of the quadrature component signal, wherein a sampling period is equal to an inverse of a frequency of the first control signal;

wherein the filter system exhibits a linear phase-response to effect a time delay on an input signal to the filter system;

wherein coefficients of the filter system are determined by:

determining a filter kernel including a first set of coefficients;

upsampling the filter kernel by a factor by interpolating the first set of coefficients to determine a first set of modified filter coefficients;

delaying the first set of modified filter coefficients by a number of samples to determine a second set of modified filter coefficients, wherein the number of samples is determined by the factor; and downsampling the filter kernel by the factor by interpolating the second set of modified filter coefficients by the factor to determine the coefficients of the filter system.

5. A system, comprising:

an input terminal configured to receive a quadrature signal;

a decoder configured to process the quadrature signal into an analog in-phase component signal and an analog quadrature component signal;

a first multiplexer coupled to the decoder and including a first output terminal, the first multiplexer being configured to:

receive the analog in-phase component signal, receive the analog quadrature component signal, receive a first control signal, and at a frequency determined by the first control signal, alternately output the analog in-phase component signal and the analog quadrature component signal at the output terminal as a first multiplexer output signal;

an analog-to-digital converter configured to:

sample analog values from the first multiplexer output signal,

16 convert the analog values into corresponding digital values, and output the digital values as a digital output stream;

a demultiplexer connected to the analog-to-digital converter, the demultiplexer being configured to:

receive the digital output stream, receive a second control signal, and at a frequency determined by the second control signal, alternately output the digital output stream at a first output terminal of the demultiplexer as a digital representation of the in-phase component signal and a second output terminal of the demultiplexer as a digital representation of the quadrature component signal; and a filter system configured to impose a one-half sampling period delay on at least one of the digital representation of the in-phase component signal and the digital representation of the quadrature component signal, wherein a sampling period is equal to an inverse of a frequency of the first control signal;

wherein the frequency determined by the first control signal is twice a frequency of a sampling frequency of the system.

6. The system of claim 5, wherein the filter system is configured to upsample at least one of the digital representation of the in-phase component signal and the digital representation of the quadrature component signal by a factor, delay the upsampled signal by a number of samples determined by the factor, and downsample the delayed signal by the factor.

7. A system, comprising:

a first input configured to receive an analog in-phase component signal of a quadrature signal;

a second input configured to receive an analog quadrature component signal of the quadrature signal;

a multiplexer including a first output terminal, the multiplexer being configured to alternately output the analog in-phase component signal and the analog quadrature component signal at the output terminal as a multiplexer output signal;

an analog-to-digital converter configured to:

sample analog values from the multiplexer output signal, convert the analog values into corresponding digital values, and output the digital values as a digital output stream;

a demultiplexer connected to the analog-to-digital converter, the demultiplexer being configured to alternately output the digital output stream at a first output terminal of the demultiplexer as a digital representation of the in-phase component signal and a second output terminal of the demultiplexer as a digital representation of the quadrature component signal;

a filter system configured to impose a one-half sampling period delay on at least one of the digital representation of the in-phase component signal and the digital representation of the quadrature component signal;

wherein the filter system is configured to upsample at least one of the digital representation of the in-phase component signal and the digital representation of the quadrature component signal by a factor, delay the upsampled signal by a number of samples determined by the factor, and downsample the delayed signal by the factor.

8. The system of claim 7, wherein a sampling period is equal to an inverse of an operational frequency of operation of the multiplexer.

9. The system of claim 7, wherein the filter system exhibits a linear phase-response to effect a time delay on an input signal to the filter system.

10. The system of claim 7, wherein the analog-to-digital converter includes a charge redistribution successive approximation analog-to-digital converter.

11. A system, comprising:

a first input configured to receive an analog in-phase component signal of a quadrature signal;

a second input configured to receive an analog quadrature component signal of the quadrature signal;

a multiplexer including a first output terminal, the multiplexer being configured to alternately output the analog in-phase component signal and the analog quadrature component signal at the output terminal as a multiplexer output signal;

an analog-to-digital converter configured to:

sample analog values from the multiplexer output signal, convert the analog values into corresponding digital values, and output the digital values as a digital output stream;

a demultiplexer connected to the analog-to-digital converter, the demultiplexer being configured to alternately output the digital output stream at a first output terminal of the demultiplexer as a digital representation of the in-phase component signal and a second output terminal of the demultiplexer as a digital representation of the quadrature component signal;

a filter system configured to impose a one-half sampling period delay on at least one of the digital representation of the in-phase component signal and the digital representation of the quadrature component signal;

wherein a sampling period is equal to an inverse of an operational frequency of operation of the multiplexer;

wherein the frequency of operation of the multiplexer is twice a frequency of a sampling frequency of the system.

12. The system of claim 11, wherein the filter system is configured to upsample at least one of the digital representation of the in-phase component signal and the digital representation of the quadrature component signal by a factor, delay the upsampled signal by a number of samples determined by the factor, and downsample the delayed signal by the factor.

13. A system, comprising:

a first input configured to receive an analog in-phase component signal of a quadrature signal;

a second input configured to receive an analog quadrature component signal of the quadrature signal;

a multiplexer including a first output terminal, the multiplexer being configured to alternately output the analog in-phase component signal and the analog quadrature component signal at the output terminal as a multiplexer output signal;

an analog-to-digital converter configured to:

sample analog values from the multiplexer output signal, convert the analog values into corresponding digital values, and output the digital values as a digital output stream;

a demultiplexer connected to the analog-to-digital converter, the demultiplexer being configured to alternately output the digital output stream at a first output terminal of the demultiplexer as a digital representation of the in-phase component signal and a second output terminal of the demultiplexer as a digital representation of the quadrature component signal;

a filter system configured to impose a one-half sampling period delay on at least one of the digital representation of the in-phase component signal and the digital representation of the quadrature component signal;

wherein the filter system exhibits a linear phase-response to effect a time delay on an input signal to the filter system;

wherein coefficients of the filter system are determined by:

determining a filter kernel including a first set of coefficients;

upsampling the filter kernel by a factor by interpolating the first set of coefficients to determine a first set of modified filter coefficients;

delaying the first set of modified filter coefficients by a number of samples to determine a second set of modified filter coefficients, wherein the number of samples is determined by the factor; and downsampling the filter kernel by the factor by interpolating the second set of modified filter coefficients by the factor to determine the coefficients of the filter system.

14. The system of claim 13, wherein the filter system is configured to upsample at least one of the digital representation of the in-phase component signal and the digital representation of the quadrature component signal by a factor, delay the upsampled signal by a number of samples determined by the factor, and downsample the delayed signal by the factor.

15. A method, comprising:

receiving an analog in-phase component signal of a quadrature signal and an analog quadrature component signal of the quadrature signal;

alternately outputting the analog in-phase component signal and the analog quadrature component signal as a first output signal;

sampling analog values from the first output signal;

converting the analog values into corresponding digital values;

outputting the digital values as a digital output stream;

alternately output the digital output stream as a digital representation of the in-phase component signal and a digital representation of the quadrature component signal;

upsampling at least one of the digital representation of the in-phase component signal and the digital representation of the quadrature component signal by a factor of two to generate an upsampled signal;

delaying the upsampled signal by a single sample to generate a delayed signal; and downsampling the delayed signal by a factor of two.

16. The method of claim 15, further comprising imposing a one-half sampling period delay on at least one of the digital representation of the in-phase component signal and the digital representation of the quadrature component signal.

17. The method of claim 15, further comprising imposing delays to both the digital representation of the in-phase component signal and the digital representation of the quadrature component signal to effect a one-half sampling period delay between the digital representation of the in-phase component signal and the digital representation of the quadrature component signal.

18. A method, comprising:

receiving an analog in-phase component signal of a quadrature signal and an analog quadrature component signal of the quadrature signal;

alternately outputting the analog in-phase component signal and the analog quadrature component signal as a first output signal;

sampling analog values from the first output signal;

converting the analog values into corresponding digital values;

outputting the digital values as a digital output stream;

alternately output the digital output stream as a digital representation of the in-phase component signal and a digital representation of the quadrature component signal;

upsampling at least one of the digital representation of the in-phase component signal and the digital representation of the quadrature component signal by a factor of four to generate a first upsampled signal;

delaying the first upsampled signal by a single sample to generate a first delayed signal; and downsampling the first delayed signal by a factor of four to generate a first output signal.

19. The method of claim 18, further comprising:

upsampling at least one of the digital representation of the in-phase component signal and the digital representation of the quadrature component signal by a factor of two to generate an upsampled signal;

delaying the upsampled signal by a single sample to generate a delayed signal; and downsampling the delayed signal by a factor of two.

20. The method of claim 18, further comprising:

upsampling the other of the digital representation of the in-phase component signal and the digital representation of the quadrature component signal by a factor of four to generate a second upsampled signal;

delaying the second upsampled signal by three samples to generate a second delayed signal; and downsampling the second delayed signal by a factor of four to generate a second output signal, wherein the second output signal is delayed with respect to the first output signal by a one-half sampling period delay.

* * * * *